United States Patent
Bunyan et al.

(10) Patent No.: US 8,119,191 B2
(45) Date of Patent: Feb. 21, 2012

(54) DISPENSABLE CURED RESIN

(75) Inventors: Michael H. Bunyan, Chelmsford, MA (US); Phillip Blazdell, Bicester (GB)

(73) Assignee: Parker-Hannifin Corporation, Cleveland, OH (US)

( * ) Notice: Subject to any disclaimer, the term of this patent is extended or adjusted under 35 U.S.C. 154(b) by 1017 days.

(21) Appl. No.: 11/729,500

(22) Filed: Mar. 28, 2007

(65) Prior Publication Data

US 2007/0230131 A1    Oct. 4, 2007

Related U.S. Application Data

(63) Continuation-in-part of application No. 10/346,346, filed on Jan. 16, 2003, now Pat. No. 7,208,192.

(60) Provisional application No. 60/786,633, filed on Mar. 28, 2006.

(51) Int. Cl.
*B05D 5/12* (2006.01)

(52) U.S. Cl. ............... 427/96.3; 427/284; 427/427.4

(58) Field of Classification Search .............. 427/96.3, 427/284, 427.4
See application file for complete search history.

(56) References Cited

U.S. PATENT DOCUMENTS

| | | | |
|---|---|---|---|
| 4,299,715 A | 11/1981 | Whitfield et al. | |
| 4,466,483 A | 8/1984 | Whitfield et al. | |
| 4,473,113 A | 9/1984 | Whitfield et al. | |
| 4,602,678 A | 7/1986 | Fick | |
| 4,606,962 A | 8/1986 | Reylek et al. | |
| 4,654,754 A | 3/1987 | Daszkowski | |
| 4,685,987 A | 8/1987 | Fick | |
| 4,764,845 A | 8/1988 | Artus | |
| 4,782,893 A | 11/1988 | Thomas | |
| 4,842,911 A | 6/1989 | Fick | |
| 4,852,646 A | 8/1989 | Dittmer et al. | |
| 4,869,954 A | 9/1989 | Squitieri | |
| 4,965,699 A | 10/1990 | Jorden et al. | |
| 4,974,119 A | 11/1990 | Martin | |
| 4,979,074 A | 12/1990 | Morley et al. | |
| 5,060,114 A | 10/1991 | Feinberg et al. | |
| 5,079,300 A | 1/1992 | Dubrow et al. | |
| 5,137,959 A | 8/1992 | Block et al. | |
| 5,151,777 A | 9/1992 | Akin et al. | |
| 5,167,851 A | 12/1992 | Jamison et al. | |
| 5,194,480 A | 3/1993 | Block et al. | |
| 5,213,868 A | 5/1993 | Liberty et al. | |
| 5,250,209 A | 10/1993 | Jamison et al. | |
| 5,298,791 A | 3/1994 | Liberty et al. | |
| 5,309,320 A | 5/1994 | Smith | |
| 5,321,582 A | 6/1994 | Casperson | |
| 5,359,768 A | 11/1994 | Haley | |
| 5,467,251 A | 11/1995 | Katchmar | |
| 5,471,027 A | 11/1995 | Call et al. | |
| 5,510,174 A | 4/1996 | Litman | |
| 5,533,256 A | 7/1996 | Call et al. | |
| 5,545,473 A | 8/1996 | Ameen et al. | |
| 5,665,809 A | 9/1997 | Wojtowicz | |
| 5,679,457 A | 10/1997 | Bergerson | |
| 5,741,877 A | 4/1998 | Tiffany | |
| 5,781,412 A | 7/1998 | de Sorgo | |
| 5,929,138 A | 7/1999 | Mercer et al. | |
| 6,031,025 A | 2/2000 | Mercer et al. | |
| 6,054,198 A * | 4/2000 | Bunyan et al. | 428/40.5 |
| 6,265,466 B1 * | 7/2001 | Glatkowski et al. | 523/137 |
| 6,303,180 B1 * | 10/2001 | Bunyan et al. | 427/58 |
| 6,458,628 B1 * | 10/2002 | Distefano et al. | 438/126 |
| 6,762,237 B2 * | 7/2004 | Glatkowski et al. | 524/496 |
| 7,208,192 B2 * | 4/2007 | Bunyan et al. | 427/58 |
| 2002/0022136 A1 | 2/2002 | Valade et al. | |
| 2003/0113531 A1 | 6/2003 | Hajmrle et al. | |
| 2006/0099404 A1 * | 5/2006 | Yoshimura et al. | 428/323 |

FOREIGN PATENT DOCUMENTS

| | | |
|---|---|---|
| EP | 0613552 A1 | 3/1995 |
| EP | 643551 | 3/1995 |
| WO | WO-96/05602 | 2/1996 |
| WO | WO-96/37915 | 11/1996 |
| WO | WO 99/18765 A1 | 4/1999 |
| WO | WO-00/63968 | 10/2000 |
| WO | WO 03/013199 A2 | 2/2003 |
| WO | WO 03/103044 A1 | 12/2003 |
| WO | WO 2004/110951 A1 | 12/2004 |

OTHER PUBLICATIONS

U.S. Appl. No. 09/212,111, filed Dec. 15, 1998.
Supplementary European Search Report of corresponding application No. EP 07754389 dated May 10, 2010.

* cited by examiner

*Primary Examiner* — Brian K Talbot
(74) *Attorney, Agent, or Firm* — Rissman Hendricks & Oliverio LLP

(57) ABSTRACT

The present invention discloses methods, materials and devices for facilitating electromagnetic/radiofrequency interference (EMI/RFI) shielding and thermal management in packaging circuits. More specifically, a method of packaging integrated circuits with improved thermal and EMI management, a process of treating a compound for use as a thermal interface and/or an EMI shield, and an EMI shielding and thermal management apparatus. More specifically, the present invention divulges methods and apparatuses for adjusting viscosity of a thermally and/or electrically conductive (or thermally conductive and/or electrically insulative), form-in-place, fully cured compound thereby rendering the compound dispensable. Further, a process of treating a compound for use as a thermal interface or/and an EMI shield is disclosed. The compound is an admixture of a particulate filler component and a pre-cured gel component. The process includes applying a shearing force on the compound, thereby rendering the compound dispensable.

15 Claims, No Drawings

DISPENSABLE CURED RESIN

CROSS-REFERENCE TO RELATED APPLICATIONS

This application is a continuation-in-part of U.S. Application No. 10/346,346, filed Jan. 16, 2003, now U.S. Pat. No. 7,208,192, issued Apr. 24, 2007, and claims the benefit of priority from U.S. Provisional Application No. 60/786,633, filed on Mar. 28, 2006.

BACKGROUND OF THE INVENTION

The present invention generally relates to methods, materials and devices for improved electromagnetic/radiofrequency interference (EMI/RFI) shielding and thermal management in packaging electronic circuits. More particularly, the present invention relates to methods, materials and devices for the adjustment of viscosity of a thermally and/or electrically conductive, form-in-place, fully cured compound, utilized for EMI/RFI shielding and thermal management in packaging electronic circuits, thereby rendering the compound dispensable.

Circuit designs for modem electronic devices such as televisions, radios, computers, medical instruments, business machines, communications equipment, and the like have become increasingly complex and compact. For example, integrated circuits have been manufactured for these and other devices which contain the equivalent of hundreds of thousands of transistors. Although the complexity of the designs has increased, the size of the devices has continued to shrink with improvements in the ability to manufacture smaller electronic components, and to pack more of these components in an ever smaller area.

As electronic components have become smaller and more densely packed on integrated boards and chips, designers and manufacturers now are faced with the challenge of how to dissipate the heat which is inevitably generated by these components. Indeed, it is well known that many electronic components, and especially power semiconductor components such as transistors and microprocessors, are more prone to failure or malfunction at high temperatures. Thus, the ability to dissipate heat often is a limiting factor on the performance of the component.

Electronic components within integrated circuits traditionally have been cooled via forced or convective circulation of air within the housing of the device. In this regard, cooling fins have been provided as an integral part of the component package or as separately attached thereto for increasing the surface area of the package exposed to convectively-developed air currents. Electric fans additionally have been employed to increase the volume of air which is circulated within the housing. For high power circuits and the smaller but more densely packed circuits typical of current electronic designs, however, simple air circulation often has been found to be insufficient to adequately cool the circuit components.

Heat dissipation beyond that which is attainable by simple air circulation may be effected by the direct mounting of the electronic component to a thermal dissipation member such as a "cold plate" or other heat sink or spreader. The dissipation member may be a dedicated, thermally-conductive ceramic or metal plate or finned structure, or simply the chassis or circuit board of the device. However, beyond the normal temperature gradients between the electronic component and the dissipation member, an appreciable temperature gradient is developed as a thermal interfacial impedance or contact resistance at the interface between the bodies.

The faying thermal interface surfaces of the component and heat sink typically are irregular, either on a gross or a microscopic scale. When the interface surfaces are mated, pockets or void spaces are developed therebetween in which air may become entrapped. These pockets reduce the overall surface area contact within the interface which, in turn, reduces the heat transfer area and the overall efficiency of the heat transfer through the interface. Moreover, as it is well known that air is a relatively poor thermal conductor, the presence of air pockets within the interface reduces the rate of thermal transfer through the interface.

To improve the heat transfer efficiency through the interface, a pad or other layer of a thermally-conductive, electrically-insulating material often is interposed between the heat sink and electronic component to fill in any surface irregularities and eliminate air pockets. Initially employed for this purpose were materials such as silicone grease or wax filled with a thermally conductive filler such as aluminum oxide. Such materials usually are semi-liquid or solid at normal room temperature, but may liquefy or soften at elevated temperatures to flow and better conform to the irregularities of the interface surfaces. Examples of such materials are described in U.S. Pat. Nos. 5,250,209; 5,167,851; 4,764,845; 4,473,113; 4,466,483; and 4,299,715, the pertinent disclosures of which are incorporated herein by reference in their entireties.

The greases and waxes of the aforementioned types heretofore known in the art, however, generally are not self-supporting or otherwise form-stable at room temperature, and are considered to be messy to apply to the interface surface of the heat sink or electronic component. To provide these materials in the form of a film which often is preferred for ease of handling, a substrate, web, or other carrier must be provided which introduces another interface layer in or between which additional air pockets may be formed. Moreover, the use of such materials typically involves hand application or lay-up by the electronics assembler which increases manufacturing costs.

Alternatively, another approach is to substitute a cured, sheet-like material in place of the silicone grease or wax. Such materials may be compounded and contain one or more thermally-conductive particulate fillers dispersed within a polymeric binder. These materials may be provided in the form of cured sheets, tapes, pads, or films. Typical binder materials include silicones, urethanes, thermoplastic rubbers, and other elastomers, with typical fillers including aluminum oxide, magnesium oxide, zinc oxide, boron nitride, and aluminum nitride.

Exemplary of the aforesaid interface materials are alumina or boron nitride-filled silicone or urethane elastomers which are marketed under the name CHO-THERM™ and THERM-A-GAP™ by the Parker-Hannifin Corporation. See, also, U.S. Pat. No. 4,869,954, which discloses a cured, form-stable, sheet-like, thermally-conductive material for transferring thermal energy. The material is formed of a urethane binder, a curing agent, and one or more thermally conductive fillers. The fillers, which may include aluminum oxide, aluminum nitride, boron nitride, magnesium oxide, or zinc oxide, range in particle size from about 1-50 microns (0.05-2 mils). Similar materials are described in U.S. Pat. Nos. 5,679,457; 5,545,473; 5,533,256; 5,510,174; 5,471,027; 5,359,768; 5,321,582; 5,309,320; 5,298,791; 5,213,868; 5,194,480; 5,151,777; 5,137,959; 5,060,114; 4,979,074; 4,974,119; 4,965,699; 4,869,954; 4,842,911; 4,782,893; 4,685,987; 4,654,754; 4,606,962; 4,602,678; and in WO 96/37915. Other materials, including gel or gel-like binders or carrier fillers, are described in U.S. Pat. Nos. 6,031,025; 5,929,138; 5,741,877; 5,665,809; 5,467,251; 5,079,300; 4,852,646; and in WO 96/05602, WO 00/63968; and EP 643,551. The respective disclosures of these references are incorporated herein by reference thereto.

Sheets, pads, and tapes of the above-described types have garnered general acceptance for use as interface materials in the conductive cooling of electronic component assemblies such as the semiconductor chips, i.e., dies, described in U.S. Pat. No. 5,359,768. In certain applications, however, heavy fastening elements such as springs, clamps, and the like are required to apply enough force to conform these materials to the interface surfaces in order to attain enough surface for efficient thermal transfer. Indeed, for some applications, materials such as greases and waxes which liquefy, melt, or soften at elevated temperature continue to be preferred as better able to conform to the interface surfaces under relatively low clamping pressures.

Recently, phase-change materials have been introduced which are self-supporting and form-stable at room temperature for ease of handling, but which liquefy or otherwise soften at temperatures within the operating temperature range of the electronic component to form a viscous, thixotropic phase which better conforms to the interface surfaces. These phase-change materials, which may be supplied as free-standing films, or as heated screens printed onto a substrate surface, advantageously function much like greases and waxes in conformably flowing within the operating temperature of the component under relatively low clamping pressures of about 5 psi (35 kPa). Such materials are further described in commonly-assigned U.S. Pat. No. 6,054,198 and U.S. application Ser. No. 09/212,111, filed Dec. 15, 1998 and entitled "Method of Applying a Phase Change Interface Material," and are marketed commercially under the names THERMFLOW™ T310, T443, T705, T710, T725, and A725 by the Parker-Hannifin Corporation. Other phase-change materials are marketed commercially by the Bergquist Company (Minneapolis, Minn.) under the tradename HI-FLOW™, by Thermagon, Inc. (Cleveland, Ohio) under the tradename T-PCM™, and by Orcus, Inc. (Stilwell, Kans.) under the tradename THERMAPHASE™. A phase-change material/metal foil laminate is also marketed by Thermagon, Inc. under the tradename T-MATE™.

For a typical commercial application, the thermal interface material may be supplied in the form of a tape or sheet which includes an inner and outer release liner and an interlayer of a thermal compound. Unless the thermal compound is inherently tacky, one side of the compound layer may be coated with a thin layer of a pressure-sensitive adhesive (PSA) for the application of the compound to the heat transfer surface of a heat sink. In order to facilitate automated dispensing and application, the outer release liner and compound interlayer of the tape or sheet may be die cut to form a series of individual, pre-sized pads. Each pad thus may be removed from the inner release liner and bonded to the heat sink using the adhesive layer in a conventional "peel and stick" application which may be performed by the heat sink manufacturer.

With the pad being adhered to the heat transfer surface of the thermal dissipation member, such as a heat sink or spreader, and with the outer liner in place to form a protective cover, the outer surface of the compound layer, the dissipation member and the pad may be provided as an integrated assembly. Prior to installation of the assembly, the outer release liner is removed from the compound layer, and the pad positioned on the electronic component. A clamp may be used to secure the assembly in place.

Other materials are exemplified in U.S. Pat. No. 5,467,251, and in commonly-assigned U.S. Pat. No. 5,781,412. Materials marketed commercially by the Parker-Hannifin Corporation under the name THERM-A-FORM™ are commonly referred to as thermal interface compounds, caulks, form-in-place materials, or encapsulants. These materials typically are supplied as charged within one or more tubes, containers, and the like as, most often, one or two-part liquid or otherwise fluent, filled reactive systems which cure at room or elevated temperatures to form-in-place within the gap or component to which the compound is applied. Typical applicators include cartridge or tube guns or other dispensing systems.

In view of the variety of materials and applications available for use in thermal management, as exemplified in the foregoing, it is to be expected that continued improvements in such materials and applications in thermal management materials would be useful to electronics manufacturers.

SUMMARY OF THE INVENTION

A method of packaging integrated circuits with improved thermal and EMI management is disclosed. The method includes reducing the viscosity of a compound by the application of a shearing force to the compound. This viscosity reduction renders the compound dispensable, and the compound is dispensed onto the integrated circuits to provide a thermal and EMI management layer. The compound is an admixture of a pre-cured gel component, and a particulate filler component.

DETAILED DESCRIPTION OF THE INVENTION

The present invention is directed toward methods, materials and devices for facilitating electromagnetic/radiofrequency interference (EMI/RFI) shielding and thermal management in packaging circuits. More specifically, the present invention is directed toward a method of packaging integrated circuits with improved thermal and EMI management, a process of treating a compound for use as a thermal interface and/or an EMI shield, and an EMI shielding and thermal management apparatus. Still more specifically, the present invention is directed to methods, materials and devices for facilitating the adjustment of viscosity of a thermally and/or electrically conductive (or thermally conductive and/or electrically insulative), form-in-place, fully cured compound, thereby rendering the compound easily dispensable.

The present invention comprises several embodiments that provides for the adjustment of the viscosity of thermally and/or electrically conductive, thermally conductive and/or electrically insulative, form-in-place, fully cured gap filler materials thereby rendering the materials dispensable. Various modifications to the disclosed embodiments will be readily apparent to those of ordinary skill in the art, and the disclosure set forth herein may be applicable to other embodiments and applications without departing from the spirit and scope of the present invention and the claims hereto appended. Thus, the present invention is not intended to be limited to the embodiments described, but is to be accorded the broadest scope consistent with the disclosure set forth herein.

Before describing in detail specific embodiments that are in accord with the principles of the present invention, it may be noted that the embodiments described herein are intended to be illustrative only. Accordingly, the method steps and apparatus components have been appropriately illustrated providing details that are pertinent to understanding the embodiments of the present invention so as not to obscure the disclosure with details that will be readily apparent to those of ordinary skill in the art having the benefit of the description to be provided herein.

In this document, relational terms such as first and second, and the like may be used solely to distinguish one entity or action from another entity or action without necessarily requiring or implying any such actual relationship or order amid such entities or actions. The term "comprises," "comprising," "comprised of," or any other variation thereof, are intended to cover a non-exhaustive inclusion, or be as inclusive as possible. For instance, a method or an apparatus that comprises a list of elements does not include only those elements but may include other elements not expressly listed or inherent to such method, apparatus or system. An element proceeded by "comprises" does not, without more constraints, preclude the existence of additional identical elements in the method, or apparatus that comprises the element.

According to certain aspects of the invention there is provided a process of treating a compound for use as a thermal interface and/or an EMI shield. The process includes applying a shearing force on the compound, and rendering the compound dispensable. The compound is an admixture of a particulate filler component and a pre-cured gel component.

In accordance with certain other aspects of the invention there is disclosed a method of packaging integrated circuits with improved thermal and EMI management. The method includes adjusting the viscosity of a compound by the application of a shearing force, thereby rendering the compound dispensable. The compound is an admixture of a pre-cured gel component, and a particulate filler component. The processed compound which is made dispensable is dispensed onto the integrated circuits to provide a thermal and EMI management layer.

According to still other aspects of the invention there is provided an EMI shielding and thermal management assembly comprising: a first surface having a first area; a second surface, opposite the first surface, having a second area; and a thermally and/or electrically conductive interface intermediate the first and second surface to provide a thermally and/or electrically conductive pathway therebetween, wherein the interface comprises a thermally and/or electrically conductive compound prepared by the implementation of a process comprising: modulating the viscosity of the compound by the application of a shearing force thereby rendering the compound dispensable, wherein the compound is an admixture of a pre-cured gel component, and a particulate filler component.

Typically, heat generated by a semiconductor component package must be transferred to the ambient environment to maintain the junction temperature of the semiconductor component package within safe operating limits. Often this heat transfer process involves conduction from the package surface to a heat spreader (or heat dissipater) that can more efficiently transfer the heat to the ambient environment. The spreader or dissipater is carefully joined to the package to minimize the thermal resistance of this newly formed thermal joint. Attaching the heat spreader to the semiconductor package surface requires that two commercial grade surfaces be brought into intimate contact with each other. These surfaces are usually characterized by a microscopic surface roughness superimposed on a macroscopic non-planarity that can give the surfaces a concave, convex or twisted shape. When two such surfaces are joined, contact occurs only at the high points. The low points form air-filled voids or vacuum windows commonly referred to as gaps.

In some embodiments, the configuration and implementation of an EMI shielding and thermal management assembly is disclosed in accord with the principles of the present invention. More specifically, the EMI shielding and thermal management assembly can be used in packaging circuits that provides for the adjustment of viscosity of thermally and/or electrically conductive, or thermally conductive and/or electrically insulative, form-in-place, viscoelastic, fully cured gap fillers thereby rendering them dispensable.

The EMI shielding and thermal management assembly consists of a first surface, a second surface, a thermally and/or electrically conductive (or thermally conductive and/or electrically insulative) interface intermediate the first and second surface. The first surface encloses a first area whereas the second surface, opposite the first surface, encloses a second area. For instance, the first and second surfaces are those of two distinct components, such as a heat sink, cold plate, circuit board, housing part, electronic component and the like.

Sandwiched between the surfaces, first and second, is a gap. For example, this gap may either be thermal or EMI shielding. The gap has varying specifications and dimensions. For example, the gap can have a thickness between about 0.25-3.0 mm (or in the range of 0.010-0.120 inches).

As used herein, the term "interface" refers to a material, compound, or any varying combination thereof, used for EMI shielding and thermal management. By way of example, and in no way limiting the scope of the invention, following is a non-exhaustive listing of certain generic specifications that may be taken into account regarding identification and selection of appropriate compounds and materials for the interface: material type/grade, material system (or chemical/polymer system type), filler material, shapes/semi-finished stock (or form/shape), resins or compounds, compound type, features and industry, thermal properties, such as thermal conductivity et cetera, mechanical properties, electrical and optical properties, such as electrical resistivity and conductivity and processing and physical properties, such as viscosity and so forth.

Usually, materials or compounds used as the interface eliminate interstitial gaps between thermal transfer surfaces, such as between microprocessors and heat sinks, by conforming to the rough and uneven mating surfaces in order to increase thermal transfer efficiency. Because the material has a greater thermal conductivity than the air it replaces, the resistance across the joint decreases thereby reducing the component junction temperature. It may be noted here that the thermal interface materials can be categorized into certain categories, namely phase-change materials, thermal tapes, insulating pads, gap fillers and cure-in-place compounds, respectively.

In accordance with certain embodiments, the compound of this invention is an admixture of a pre-cured gel component and a particulate filler component. For example, and not by way of limitation, the pre-cured gel component can comprise a silicone polymer, such as a silicone resin. The compound of the present invention possesses appropriate specifications and an assortment of advantageous attributes. In certain embodiments, the compound is responsible for the conduction of heat between a hot component (i.e. the component package) and the heat sink (i.e. the heat dissipater or spreader) or enclosure. The compound is used to fill gaps of varying gap specifications sandwiched between surfaces. The compound, unlike conventional "form-in-place" or "FIP" materials, is fully cross-linked or otherwise cured as charged in the tube, cartridge, or other container. The compound is highly conformable necessitating no further cure or mixing cycles, owing to the fact that it is fully cured and packaged in the tube, yet dispenses like a liquid compound to fill highly variable tolerances in electronics assemblies. More specifically, the compound is dispensable under an applied pressure and exhibits no appreciable settling of the filler. The compound may be stored at room temperature thereby eliminating the need for refrigerated or any other special storage. Owing to the fact that the compound excludes the need of any further mixing cycles prior to, or cure schedules subsequent to, dispensing, the compound has an unlimited shelf-life and working time and can be provided as a one-part system. The compound is form-stable and may be handled for assembly similar to a conventional molded or extruded strip, pad, sheet, or other pre-form. The compound is form-stable, soft and highly conformable, thus requiring low or substantially no force deflection. In use, the compound may be applied using automated dispensing equipment, or otherwise applied with a pneumatically or manually-operated applicator gun. The ease of application of this compound renders it ideal for rework and field repair situations.

In certain formulations, the compound of the invention is a fluent admixture of the pre-cured polymer gel component and the particulate filler component. As used herein the term "fluent," implies that the admixed compound exhibits representative fluid flow characteristics allowing it to be extruded under pressure through a dispensing nozzle, needle, or other orifice at a given flow velocity. For example, flow rates of approximately 10 cc/min or about 2 g/min through a 0.047 inch (1 mm) orifice under an applied pressure of about 90 psi (620 kPa) may be observed.

In certain embodiments compliant with the principles of the present invention, the compound is viscoelastic or has a viscoelastic property. As used herein, the term "viscoelasticity/viscoelastic property" (otherwise known as anelasticity) describes those materials that exhibit both viscous and elastic characteristics. Specifically, viscoelasticity is owing to a molecular rearrangement within these materials. On application of a stress (or shear stress or shearing force) to the viscoelastic materials or compounds, such as polymers, parts of the long polymer chain can change position. This movement or rearrangement is called creep. Further, the term "viscoelastic materials/compounds" are compounds that have an elastic component and a viscous component. For example, polymers remain a solid material even when the aforementioned parts of their chains are rearranged in order to accompany the stress, and as this occurs, it creates a back stress in the compound. When the back stress is the same magnitude as the applied stress, the material no longer creeps. When the original stress is taken away, the accumulated back stresses will cause the polymer to return to its original form. The material creeps, which gives the prefix visco-, and the material fully recovers, which gives the suffix -elasticity.

The viscoelastic compound of the present invention exhibits, in gross morphological aspects, a continuous phase for the pre-cured gel component and a discrete phase regarding the particulate filler component, dispersed in the continuous phase. For instance, the fully cured compound is viscoelastic, e.g., about 15 million cps, at about normal room temperature, i.e., about 25-30° C., such that the composition may be dispensed from a nozzle, needle, or other orifice as a generally form-stable bead, mass, or other form. In certain other embodiments, the compound has a viscosity of about 7.5 million cps.

In accordance with the principles of the present invention, the compound is form stable, since it stands in the tube, and viscoelastic when dispensed, yet it takes virtually no compressive force to deform under assembly pressure, leaving solder joints and leads stress free. By "form-stable," is meant that the quantity of the composition which is applied to the substrate exhibits, at steady-state, substantially no appreciable, i.e., 25% or less, slump, sag, running, or other flow, at least at temperatures within the range of normal room temperature.

By "cured" it is meant that the pre-cured gel component, and, unless containing a reactive adjuvant or diluent, the compound itself, does not exhibit, except as may normally develop upon aging, further appreciable polymerization, cross-linking, vulcanization, hardening, drying, or other like chemical or physical change such as from its fluent gel form into a solid or semi-solid form or phase.

As used herein, the term "fully cured" implies that the compound requires no further cure or mixing, owing to the fact that it is fully cured and packaged in the tube. More specifically, the compound eliminates any further mixing cycles prior to dispensing, or cure schedules subsequent to dispensing.

It may be noted here that curing refers to the toughening or hardening of a polymer material by the cross-linking of polymer chains.

In accordance with the present invention, the present compounds are used to fill gaps in parts and structures, thereby providing a thermally and/or electrically conductive (or thermally conductive and/or electrically insulative) pathway therebetween. As disclosed herein, "thermal compound/interface (thermally conductive) materials" are those that are designed to form a thermally conductive layer on a substrate, between components or within a finished electronic product. For example, thermally conductive resins, thermoplastics, encapsulants, potting compounds, tapes, pads, adhesives and greases are often used between a heat generating device (or heat source) and a heat sink to improve heat dissipation. In certain embodiments, the compound of the present invention can have a thermal conductivity of about 0.7 W/m-k.

Likewise, "electrically conductive compounds" are resins with a high degree of electrical conductivity (low resistivity) for applications such as anti-static or electrostatic discharge (ESD) control, EMI/RFI shielding, thick film metallization and device and board electrical interconnection. On the contrary, "electrically insulative/dielectric materials" are those that are used to form a barrier or isolator between electrical or electronic components. The voltage potential between the conductor and conductive components will influence material selection based on the dielectric strength in order to reduce shorting. The dielectric constant and loss tangent are important parameters in minimizing cross-talk between insulated circuit paths. Additionally, "EMI/RFI shielding materials" are polymers or elastomers that are designed to provide shielding from electromagnetic interference (EMI) or radio frequency interference (RFI). Typically, these compounds have a high degree of electrical conductivity.

As disclosed herein, "sealant (gap filling/form-in-place/FIP gasket)" are gap filling or under fill compounds that are used to fill in gaps or spaces between two surfaces to be bonded or sealed. For example, flexible sheet materials as well as sealants or FIP compounds (FIP, liquid and viscous materials) are used to fill gaps between seams, or on surfaces, to contain fluids, prevent leaks, and prevent infiltration of unwanted material.

In certain embodiments compliant with the principles of the present invention, the compound may possess the following specifications: percentage total weight of the particulate filler component about 20-80%; thermal conductivity of about 0.7 W/m-k; viscosity of about 7.5 million cps; operating temperature ranging from a minimum of approximately −50° C. to a maximum of roughly 150° C.; specific gravity of 2.25; weight loss of approximately 0.2% in 24 hours at 150° C. upon performance of a thermogravimetric analysis (TGA);

flow rate of approximately 10 cc/min; percentage of extractable silicones (i.e. the pre-cured gel component) 6%; dielectric strength of approximately 1000 Vac/mil @ 10 mil; volume resistivity of approximately $1\times10^{14}$ ohm-cm; and shelf life of 18 months at room temperature.

In illustrative embodiments of the present invention, the compound is formulated so to behave as, or be, a fluent under an applied pressure, yet form-stable as applied to a surface or within a gap, as a blend or other admixture of: the pre-cured gel component; and the particulate filler, which may be thermally and/or electrically-conductive particles or a blend thereof.

The pre-cured gel component may be, for example, a thermoplastic gel or a silicone gel or a silicone resin, which may be an organopolysiloxane. Advantageously, the compound may be filled, such as to a loading level of between about 20-80% by total weight, to exhibit a thermal conductivity of at least about 0.5 W/m-K or 0.7 W/m-k, which is comparable to that exhibited by current molded or form-in-place (FIP) materials, but still being dispensable using conventional equipment.

Classically, gels useful as the pre-cured or polymer gel component include systems based on silicones, i.e. polysiloxanes, such as polyorganosiloxane, as well as systems based on other polymers that may be thermoplastic or thermosetting, such as polyurethanes, polyureas, fluoropolymers, chlorosulfonates, polybutadienes, butyls, neoprenes, nitrites, polyisoprenes and buna-N, copolymers such as ethylene-propylene (EPR), styrene-isoprene-styrene (SIS), styrene-butadiene-styrene (SBS), ethylene-propylene-diene monomer (EPDM), nitrile-butadiene (NBR), styrene-ethylene-butadiene (SEB), and styrene-butadiene (SBR), and blends thereof such as ethylene or propylene-EPDM, EPR, or NBR.

As used herein, the term "polymer gel" is ascribed, in one sense, the conventional meaning of a fluid-extended polymer system that may include a continuous polymeric phase or network, which may be chemically, such as ionically, covalently, or physically cross-linked, and an oil, such as silicone and the like, a plasticizer, unreacted monomer, or other fluid extender which swells or otherwise fills the interstices of the network. It must be noted here that the cross-linking density of such network and the proportion of the extender can be controlled to tailor the modulus, such as softness, and other properties of the gel. The term "polymer (or silicone as the case may be) gel" also should be understood to encompass materials which alternatively may be classified broadly as pseudogels or gel-like as having viscoelastic properties similar to gels, such has by having a "loose" cross-linking network formed by relatively long cross-link chains, but as, for example, lacking a fluid-extender.

As to silicone gels, particularly preferred are soft silicone gels such as those marketed under the name "GEL-8100" by NuSil Technology (Carpinteria, Calif.). Such gels in there cured condition have a penetration value, such as per ASTM D217, of about $100\times10^{-1}$ mm. Other soft silicone gels are marketed under the designation "3-6636" by Dow Corning (Midland, Mich.).

In accordance with certain embodiments consistent with the principles of the present invention, the filler component of the compound is used to fill the pre-cured gel component during curing. Reiterating, the compound exhibits a discrete phase regarding the particulate filler component dispersed in the continuous phase of the pre-cured gel component. The filler component may possess suitable material characteristics. For example, the material used for the filler component can be selected from the group consisting of oxide, nitride, carbide, diboride, graphite, and metal particles, and mixtures. The filler component can have a mean average particle size of between about 0.01-10 inches (0.25-250 mm). The filler component may possess thermal and/or electrical properties in accord with the principles of the present invention. For example, and not by way of limitation, the filler component may be thermally conductive when the gap is thermal. In addition, the filler component can have a thermal conductivity of at least about 20 W/m-K. In contrast to this, the filler component may be electrically conductive or insulative when the gap is due to EMI/RFI.

In accordance with certain aspects of the present invention, the pre-cured gel component is rendered thermally conductive by its loading with the filler component which may comprise one or more thermally conductive particulate fillers. In this regard, the pre-cured gel component generally forms a binder into which the thermally conductive filler is dispersed. The filler is included in proportion sufficient to provide the thermal conductivity desired for the intended application, and generally will be loaded at between about 20-80% by total weight of the compound. The size and shape of the filler is not critical for the purposes of the present invention. In this regard, the filler may be of any general shape, referred to broadly as "particulate," including solid or hollow spherical or microspherical flake, platelet, irregular, or fibrous, such as chopped or milled fibers or whiskers, but preferably will be a powder to assure uniform dispersal and homogeneous mechanical and thermal properties. The particle size or distribution of the filler typically will range from between about 0.01-10 mil (0.25-250 mm), which may be a diameter, imputed diameter, length, or other dimension of the particulate matter, but may further vary depending upon the thickness of the gap to be filled. If desired, the filler may be selected as being electrically nonconductive such that the compound may be both dielectric or electrically insulating and thermally conductive. Alternatively, the filler may be electrically conductive in applications where electrical isolation is not required.

In accordance with certain other aspects of the present invention, the pre-cured gel component is rendered electrically conductive via its loading with an electrically conductive filler, which may be provided in addition to, i.e., a blend, or instead of, a thermally conductive filler. Also, depending upon the particular filler selected, such filler may function as both a thermally and an electrically conductive filler.

Suitable thermally conductive fillers generally include oxide, nitride, carbide, diboride, graphite, and metal particles, and mixtures thereof, and more particularly boron nitride, titanium diboride, aluminum nitride, silicon carbide, graphite, metals such as silver, aluminum, and copper, metal oxides such as aluminum oxide, magnesium oxide, zinc oxide, beryllium oxide, and antimony oxide, and mixtures thereof. Such fillers characteristically exhibit a thermal conductivity of between about 20-50 W/m-K. For reasons of economy, an aluminum oxide, i.e., alumina may be used, while for reasons of improved thermal conductivity a boron nitride would be considered more preferred. Loaded with the thermally conductive filler, the compound typically may exhibit a thermal conductivity, per ASTM D5470, of at least about 0.5 W/m-K and thermal impedance, also per ASTM D5470, of less than about $1°$ C.-in$^2$/W ($6°$ C.-cm$^2$/W), but as may vary depending upon the thickness of the compound layer.

The filler is loaded in the composition in a proportion sufficient to provide the level of electrical conductivity and EMI shielding effectiveness within the gap which is desired for the intended application. For most applications, an EMI shielding effectiveness of at least about 10 dB, and usually at least about 20 dB, and preferably at least about 60 dB or higher, over a frequency range of from about 10 MHz to 10 GHz is considered acceptable. Such effectiveness translates to a filler proportion which generally is between about 10-80% by volume or 50-90% by weight, based on the total volume or weight, as the case may be, of the compound, and a bulk or volume resistivity of not greater than about 1 Ω-cm, although it is known that comparable EMI shielding effectiveness may be achieved at lower conductivity levels through the use of an EMI absorptive or "lossy" filler such as a ferrite or nickel-coated graphite. As is also known, the ultimate shielding effectiveness will vary based on the amount of the electrically-conductive or other filler material, and on the film thickness.

Additional fillers and additives may be included in the formulation of the compound depending upon the requirements of the particular application envisioned. Such fillers and additives may include conventional wetting agents or surfactants, pigments, dyes, and other colorants, opacifying agents, anti-foaming agents, anti-static agents, coupling agents such as titanates, chain extending oils, tackifiers, pigments, lubricants, stabilizers, emulsifiers, antioxidants, thickeners, and/or flame retardants such as aluminum trihydrate, antimony trioxide, metal oxides and salts, intercalated graphite particles, phosphate esters, decabromodiphenyl oxide, borates, phosphates, halogenated compounds, glass, silica, which may be fumed or crystalline, silicates, mica, and glass or polymeric microspheres. Typically, these fillers and additives are blended or otherwise admixed with the formulation, and may comprise between about 0.05-80% or more by total volume thereof.

In preferred embodiments, the process for preparing the compound of the invention involves the reduction of the viscosity of the non-silicon materials comprising compounding the materials by the application of the shearing force, thereby rendering the compounds dispensable. For example, many of the non-silicon materials like epoxy and acrylics do not have the soft viscoelastic characteristics of the silicon gel used in the compound of the present invention. In such cases, the material is shear reduced in viscosity form its cured form, thereby rendering it dispensable.

In some embodiments, the compound may be prepared in a roll mill or any other conventional mixing apparatus as an admixture of one or more resins or other polymers, such as oligomers, prepolymers and the like, optionally a cross-linking agent, a catalyst and an extender (i.e. filler), and selected additive components. For example, and in no way intending to limit the scope of the invention, the compound may be prepared as an admixture of the pre-cured gel component and the particulate filler component.

During or subsequent to mixing, the admixture may be subjected to further polymerization (or curing) thereby leading to the conversion of the resin, oligomer or prepolymer into a fluid or non-fluid extended polymer gel component. Assortments of cure type/technologies are known in the art, such as thermoplastic/hot melt, thermosetting (cross-linking/vulcanizing), room temperature cure/vulcanizing, UV/radiation cured (also electron beam, light), single component systems, two component systems, etc. For example, the admixture may be heated, such as in the case of a thermal addition polymerization (i.e. cross-linking/vulcanizing) system. Alternatively, the chemical or physical gellation reaction may be under the influence of atmospheric moisture (or hydrolysis), exposure to ultraviolet (UV) radiation, electron beam (EB) or other curing mechanism, such an anaerobic cure.

Further, depending upon the chemical/polymer system employed, an inorganic or organic solvent or other diluent or theological agent may be added to control the viscosity of the final cured compound which may be adjusted for the application equipment or process to be used. For example, plastic compounds, elastomer resins or polymers can be based on the silicone chemical system.

In accordance with some embodiments of the present invention, the final compound is viscoelastic or has a viscoelastic property. The viscoelastic compound exhibits, in gross morphological aspects, a continuous phase for the pre-cured gel component and a discrete phase for the particulate filler component, dispersed in the continuous phase.

Depending on the reaction of certain non-newtonian compounds or materials to an applied shearing force, the non-newtonian compounds or materials may be categorized into two types, namely thixotropic and rheopectic respectively. More specifically, the thixotropic compounds or materials are shear-thinning compounds or materials that take a finite amount of time to reach an equilibrium viscosity when introduced to a step change in shear rate. For example, the application of the shearing force renders thixotropic compounds or materials thinner or less viscous thereby leading to a reduction in viscosity. Stated otherwise, thixotropic compounds or materials react to the shearing force by becoming thinner or less viscous owing to their thixotropic property. Thixotropy is the property whereby certain non-newtonian compounds or materials show a time-dependent change in viscosity; i.e. the longer the fluid undergoes shear owing to the shearing force, the lower its viscosity.

In contrast to this characteristic, rheopectic compounds or materials become thicker or more viscous upon the application of the shearing force. Thus, rheopecty or rheopexy is the rare property of some non-newtonian fluids to show a time-dependent change in viscosity; i.e. the longer the fluid undergoes shear, the higher its viscosity. Rheopectic fluids, such as some lubricants, thicken or solidify when shaken.

In some embodiments, a process of treating the compound for use as a thermal interface and/or an EMI shield. and a method of packaging integrated circuits with improved thermal and EMI management, is disclosed.

At the outset, the process may optionally involve the initial step of providing a supply of the fluent (i.e. viscous), form-stable (i.e. elastic) compound. More specifically, the step of providing a supply of the compound involves an assortment of routine tasks, such as identification, selection and execution of existent, or design, construction, and the implementation of novel methods, apparatuses and systems for dispensing the compound. In accordance with the principles of the present invention, appropriate cartridge and syringe systems are selected and employed. Specifically, these cartridge systems may possess appropriate specifications. The cartridge systems may include a removable dispense nozzle end cap and a plunger. These cartridge systems can be used for dispensing the compound or charging the syringe systems. Whereas, the syringe systems may be a preloaded taper tip syringes, which are offered with a preinstalled smooth flow wiper piston. For example, and in no way limiting the scope of the present invention, pneumatic dispenser systems that may be optionally selected and employed herein are a 32 oz. cartridge from Semco, namely the Semco Sealant Gun (Semco model number 550, Semco part number 231551) and/or the 30 cc syringe from Semco, that is the Semco Semmatic Series 1800, 1900, or 2000 air dispense systems (Semco Series 1800, Semco Part number 233356; Semco Series 1900, Semco Part number 233359; Semco Series 2000, Semco Part number 233100.) It must be noted here that the smaller size of the 30 cc syringes makes them desirable for rework and/or field installation. Alternatively, the larger 32 oz. cartridges are generally desirable for, but not restricted to, shop floor manufacturing, where the reloading of cartridges can be kept to a minimum.

Subsequent to the selection of the pneumatic air system for use with either the cartridge or syringe systems, the process may involve the step of detaching the end cap from selected containers of the compound. Precautions may be taken that the pistons are not removed during processing.

Next, the process may involve the step of installing the selected container of the compound into the air system as suggested by the air system manufacturer operation manual for the installation of the cartridge/syringe systems. Preventative measure may be taken so as not to connect the air system to an air supply until the cartridge has been properly installed and the operator or dispenser is prepared or set to dispense the compound manually or automatically.

Subsequently, the dispense tip can be cut to the desired diameter. It must be noted here that diameter should be sized to deliver the required flow rate. Some flow rate values are listed below to help in determining what diameter tip is needed. To deliver the highest output of material during dispensing, the nozzle should be cut to allow for the shortest length and largest orifice. The following example can be used to gauge where to cut back the dispenser tip: a 0.150 inch. diameter orifice will deliver 10 cc/min flow rate.

Next, the air dispenser system is connected or coupled to the air supply, and the air supply is set to 100 psi. Additionally, the dispenser tip is set onto a surface where the compound is to be applied. It is recommended that the syringe must be held at a slight angle of approximately 30 degrees to the surface.

After coupling, the air dispenser system is connected or coupled to the air supply, and an air pressure is applied to allow the compound to flow onto the surface. In certain embodiments, the compound is pumped and sheared to reduce its viscosity. In one particular pump application, the compound is pumped from a dispenser at a supplied viscosity of 7.5 million cps. Once the compound travels and pumps through the dispenser system, it shears the part at 1.5 million cps.

In some embodiments, the compound of the present maintains a thixotropic/semi-solid phase owing to the fact that it exhibits, in gross morphological aspects, a continuous phase for the pre-cured gel component and a discrete phase regarding the particulate filler component, dispersed in the continuous phase. Typically, viscosity decreases with time in case of thixotropic compounds. Some examples of thixotropic compounds and materials are silica gel, greases, inks, milk, mayonnaise, carboxymethyl cellulose, bentonite, etc. As a general rule, viscosity is dependent on (inversely proportional to) the rate of shear, i.e. viscosity=shear stress/rate of shear. Thixotropic compounds react to shearing force (or shear) by becoming thinner or less viscous, i.e. the reduction of viscosity owing to shearing. Thixotropic compounds return to their original viscosity when the shearing force is removed, i.e. they are viscoelastic. It must be noted here that pumping creates a shearing force.

In operation, a mass of the compound is dispensed under an applied pressure onto a primed or unprimed surface of a circuit component, such as a heat sink, cold plate, circuit board, housing part, or electronic component. More specifically, the surface of the circuit component may comprise a plastic, metal, or ceramic material. In this regard, a supply of the compound, charged as a one-part system into a cartridge, tube, or other container, is coupled to a via hose or other conduit connected to a head. The head has a nozzle. The nozzle in turn has an orifice.

Under the applied pressure, a metered amount of the compound may be issued from the nozzle and onto the aforesaid surface under processing. By way of example, and not by way of limitation, the pressure may be applied either manually or using a gun or syringe, or developed by air or airless metering equipment, such as a proportioning cylinder, pump and the like. As applied, the mass of the compound may be substantially self-adherent to the surface, such as by surface tension, a tack, or other cohesive force. Unlike grease or the like, the mass of the compound advantageously may be form-stable at normal room temperature such that the part or component to which it is applied may be handled for assembly or otherwise. Moreover, unlike conventional form-in-place compounds which may bond to the surfaces, the compound of the invention may be readily cleaned or otherwise removed from the surfaces for rework or repair.

As it is anticipated that certain changes may be made in the present invention without departing from the concepts involved herein, it is intended that all matter contained in the foregoing description shall be interpreted as illustrative only and not in a limiting sense. All references including any priority documents cited herein are expressly incorporated by reference. While the invention may be susceptible to various modifications and alternative forms, specific embodiments have been shown by way of example and have been described in detail herein. However, it should be understood that the invention is not intended to be limited to the particular forms disclosed. Rather, the invention is intended to cover all modifications, equivalents, and alternatives falling within the spirit and scope of the invention as defined by the following appended claims.

What is claimed is:

1. A process of using an elastomeric compound as a thermal interface and an EMI shield, the process consisting essentially of:
    applying a shearing force to the compound thereby reducing the viscosity of the compound to render the compound dispensable, said compound comprising a cured polymer gel component and an admixture of a particulate thermally and electrically conductive filler component, said particulate filler component having an average particle size of between about 0.01-10 mils present in an amount of from about 20-80% by total weight of the compound,
    wherein the compound is dispensed into a gap of between about 0.25 mm and about 3.00 mm intermediate a surface of a first electronic component and a second electronic component, said compound being fluent under the shearing force exerted when dispensing said compound, and form-stable in the dispenser and the gap, and wherein the cured gel component in the compound as dispensed does not exhibit further appreciable curing.

2. The process of claim 1, wherein the filler component has a thermal conductivity of at least about 20 W/m-K.

3. The process of claim 1, wherein the filler component is selected from the group consisting of oxide, nitride, carbide, diboride, graphite, and metal particles, and mixtures thereof.

4. The process of claim 1, wherein the compound has a thermal conductivity of at least about 0.5 W/m-k.

5. The process of claim 1, wherein the compound has a viscosity of about 7.5 million cps in the dispenser, and a viscosity of about 1.5 million cps upon shearing.

6. The process of claim 1, wherein the compound has an inherent operating temperature ranging from a minimum of approximately −50° C. to a maximum of roughly 150° C.

7. The process of claim 1, wherein the compound has an inherent specific gravity of 2.25.

8. The process of claim 1, wherein the compound exhibits a weight loss of approximately 0.2% in 24 hours at 150° C. upon performance of a thermogravimetric analysis (TGA) after preparation of the compound.

9. The process of claim 1, wherein the compound has a flow rate of approximately 10 cc/min when dispensed.

10. The process of claim 1, wherein the compound has approximately 6% extractable silicones after preparation of the compound.

11. The process of claim 1, wherein the compound has a dielectric strength of approximately 1000 Vac/mil @ 10 mil when dispensed in the gap.

12. The process of claim 1, wherein the compound has a volume resistivity of approximately $1\times10^{14}$ ohm-cm when dispensed in the gap.

13. The process of claim 1, wherein the compound has a shelf life of 18 months at room temperature in the dispenser.

14. The process of claim 1, wherein the compound exhibits an EMI shielding effectiveness of at least about 60 dB over a frequency range of between about 10 MHz and about 10 GHz when dispensed in the gap.

15. The process of claim 1, wherein the polymer gel component comprises a silicone polymer.

* * * * *